United States Patent [19]

O'Brien et al.

[11] Patent Number: 5,368,493
[45] Date of Patent: Nov. 29, 1994

[54] EJECTOR SYSTEM FOR AN IC PACK CONNECTOR APPARATUS

[75] Inventors: Paul O'Brien, Kilrush, Ireland; Mario Previato, Padova, Italy

[73] Assignee: Molex Incorporated, Lisle, Ill.

[21] Appl. No.: 82,652

[22] Filed: Jun. 25, 1993

[30] Foreign Application Priority Data

Jun. 26, 1992 [EP] European Pat. Off. ........ 92110895.7

[51] Int. Cl.[5] .............................................. H01R 13/62
[52] U.S. Cl. ...................................... 439/160; 439/153
[58] Field of Search ............................... 439/152–160

[56] References Cited

U.S. PATENT DOCUMENTS

| | | | |
|---|---|---|---|
| 4,778,395 | 10/1988 | Narita | 439/71 |
| 4,810,200 | 3/1989 | Sakamoto | 439/155 |
| 4,836,790 | 6/1989 | Narita | 439/68 |
| 5,011,420 | 4/1991 | Sakamoto | 439/152 |
| 5,026,296 | 6/1991 | Hashiguchi | 439/159 |
| 5,139,435 | 8/1992 | Komatsu et al. | 439/159 |
| 5,145,389 | 9/1992 | Okubo | 439/159 |
| 5,149,276 | 9/1992 | Dixon | 439/159 |
| 5,152,697 | 10/1992 | Abe et al. | 439/152 |
| 5,197,894 | 3/1993 | Koike | 439/159 |

Primary Examiner—David L. Pirlot
Attorney, Agent, or Firm—Stacey E. Caldwell

[57] ABSTRACT

An ejector mechanism (10, 110, 210) is disclosed for use with a connector apparatus which includes a housing (12, 112, 212) into which an IC pack is loaded and from which it is ejected. The three part ejector mechanism also includes a one-piece eject lever (14, 114, 214) and a one-piece actuator (16, 116, 216). The eject lever is pivotally mounted on the housing for ejecting the IC pack from the housing. The actuator is movably mounted within an integrally molded channel (34, 138, 234) on the housing and is engageable with the eject lever to effect actuation thereof. Complementary interengaging portions of the housing, the eject lever and the actuator cooperate to effect the relative movements therebetween without the need of extraneous components.

10 Claims, 9 Drawing Sheets

EJECTOR SYSTEM FOR AN IC PACK CONNECTOR APPARATUS

FIELD OF THE INVENTION

This invention generally relates to the art of electrical connectors and, particularly, to a connector apparatus having a header connector adapted for receiving a memory card or IC pack, with means directly on the connector apparatus for ejecting the IC pack therefrom.

BACKGROUND OF THE INVENTION

Header connectors are used with memory cards or IC packs and are provided with various attachments, such as means for facilitating ejection of the IC pack or memory card for replacement or temporary removal. The header connector is used for interconnecting terminals and internal circuitry of the IC pack or memory card to the traces of a substrate such as for a main electronic unit. The IC pack is inserted into the header connector and is extracted therefrom as needed. The extraction force of the IC pack, i.e. the force between the respective terminal pins on the header connector and the respective terminals of the IC pack, is relatively high due to the tight fit required to obtain a good electrical interconnection between the terminals. These terminals typically are disposed at a high density which increases the extraction forces further. Often, when an IC pack is to be extracted from a header assembly, the card is grasped by a user and pulled out.

Consequently, a variety of ejecting mechanisms have been incorporated in various connector apparatus for facilitating ejecting an IC pack from a header connector. One of the problems with prior ejecting mechanisms is that they typically consist of multi-piece designs including springs, cams and sliders and either are costly to assemble or require special features on the card or header assembly. There is a definite need for a simple, low cost, easy to assemble IC pack ejector mechanism of the character described.

This invention is directed to solving the above problems and satisfying the need for a very simple and low cost ejecting system of the character described.

SUMMARY OF THE INVENTION

An object, therefore, of the invention is to provide a new and improved, simple ejecting system in a connector apparatus for ejecting an IC pack or memory card from a header connector.

In the exemplary embodiment of the invention, a connector apparatus includes a header connector into which an IC pack is loaded and from which it is ejected. An improved ejector system is provided of only three basic components: a housing which receives and guides an IC pack into mating engagement with the header terminals, a one-piece eject lever and a one-piece manually manipulatable actuator.

Specifically, the eject lever is movably mounted on the housing for ejecting the IC pack. The actuator is movably mounted within an integrally molded channel on the housing for actuating the eject lever to eject the IC pack from the header connector. Complementary interengaging drive means between the eject lever and the actuator effect actuation of the eject lever in response to manual manipulation of the actuating member. The eject lever is pivotally mounted to the housing by integrally molded, complementary interengaging motion transmitting means. The lever is mounted to the housing intermediate opposite ends thereof. One end of the lever is engageable by the actuator, and the opposite end of the lever has an integral portion adapted to engage and effect ejection of the IC pack from the header connector. The actuator is provided in the form of an elongated push-rod movably mounted within an integrally molded channel on the housing. One end of the push-rod is engageable with the one end of the lever. The housing, the eject lever and the actuator all are individually molded of dielectric material such as plastic or the like. The complementary interengaging drive means are integrally molded with the eject lever and the actuator. Similarly, the complementary interengaging motion transmitting means are integrally molded with and interconnect the housing and the eject lever.

In one embodiment of the invention, the header connector itself incorporates the housing on which the eject lever is mounted and within which the actuator is positioned. The entire connector apparatus therefore consists of three components, one of which is the connector header itself.

In two other embodiments of the invention, the housing is separate and distinct from the connector header, and the three piece eject mechanism is therefore latchably retrofittable onto a standard header connector. This embodiment allows the eject mechanism to be removed prior to or added subsequent to soldering the header connector to a printed circuit board, and thus avoid the harsh processing conditions to which the header and other soldered components are subjected.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
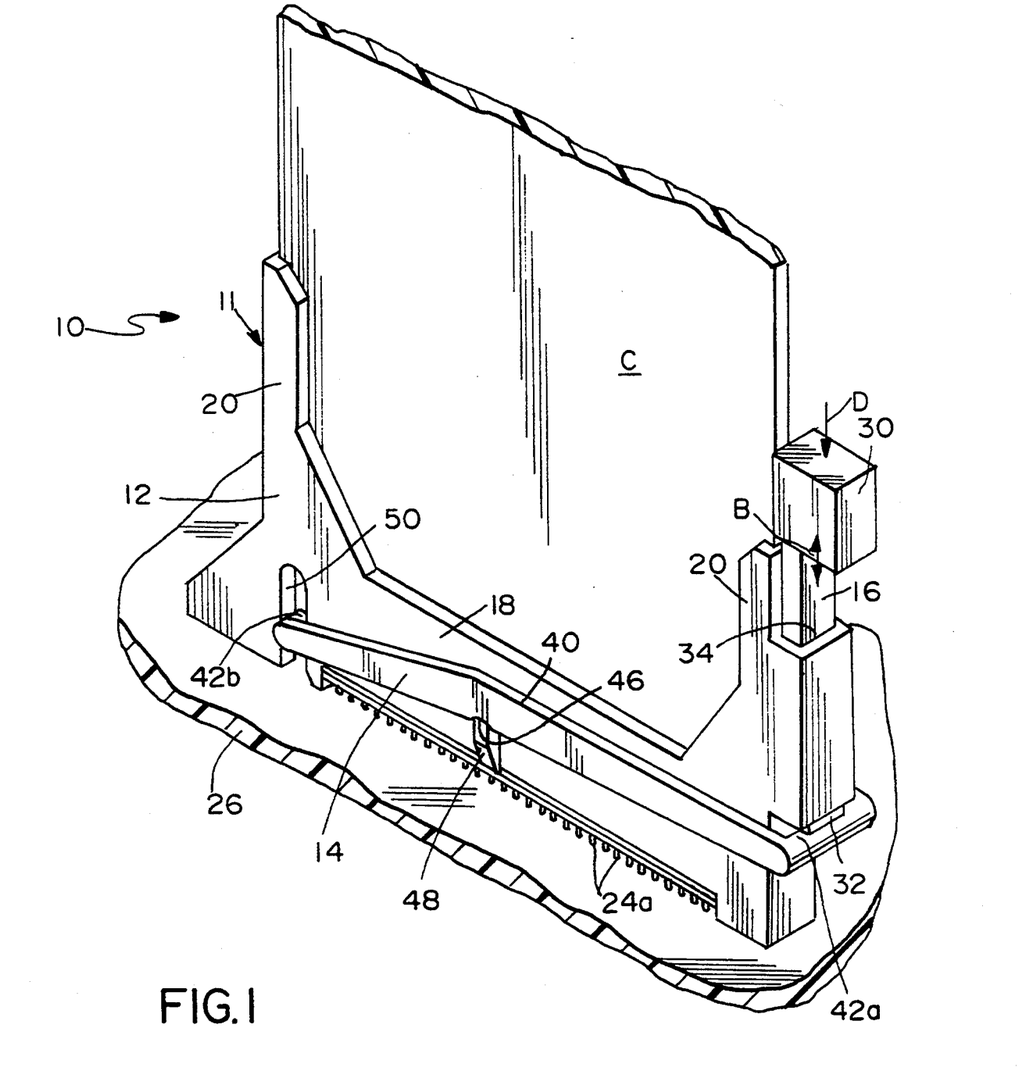
FIG. 1 is a perspective view of the three-part connector apparatus embodying the ejector system of a first embodiment of the invention.

Referring to the drawings in greater detail, and first to FIG. 1, the ejector system of the invention is embodied in a three-part ejector mechanism, generally designated 10. The mechanism is designed for incorporation directly in a connector apparatus which includes a header connector, generally designated 11, into which a memory card or IC pack "C" is loaded and from which it is ejected.

Generally, ejector mechanism 10 includes a first part in the form of a housing, generally designated 12, of header connector 11; a second part in the form of a one-piece eject lever, generally designated 14; and a third part in the form of a one-piece actuating push-rod, generally designated 16. Each of header connector housing 12, lever 14, and push-rod 16 is individually and integrally molded of dielectric material such as plastic or the like. No other extraneous components are required to assemble or to operate the mechanism.

Figure 2:
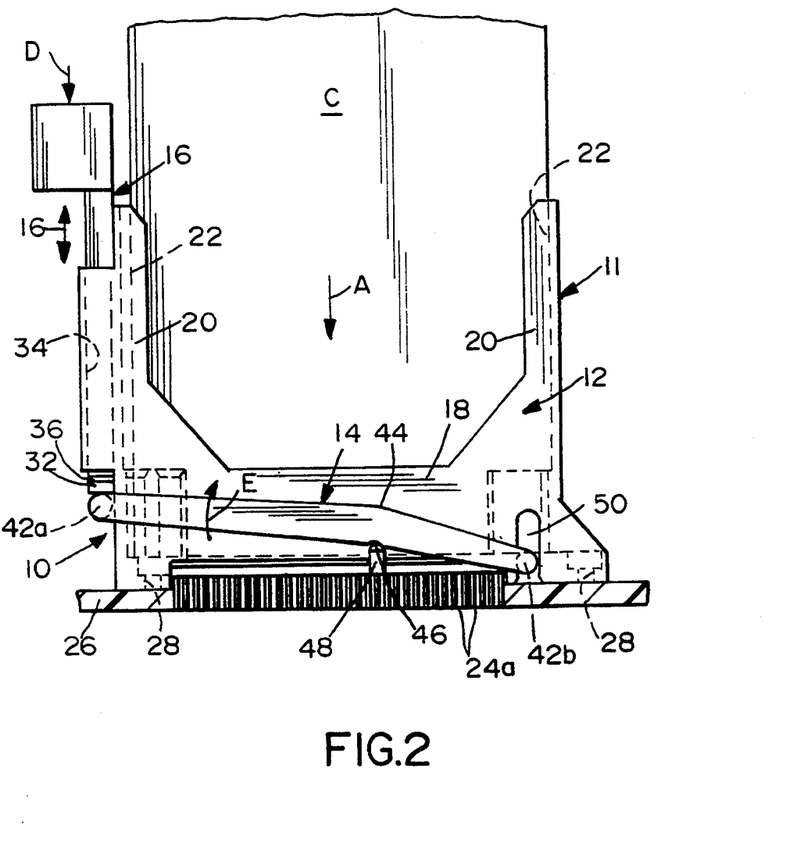
FIG. 2 is a top plan view of the apparatus.
Figure 3:
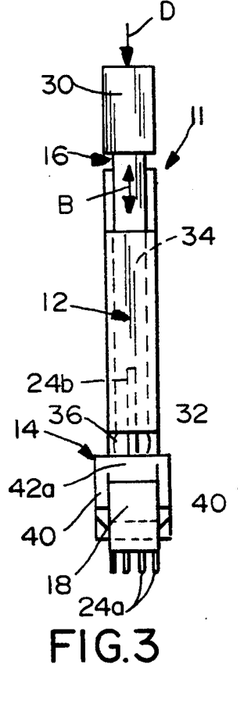
FIG. 3 is a side elevational view of the apparatus, looking toward the left-hand side of FIG. 1.
Figure 4:
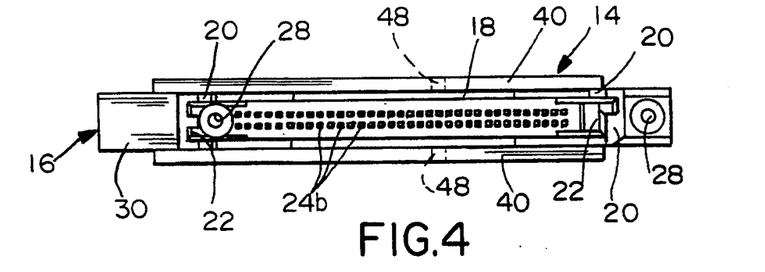
FIG. 4 is an end elevational view of the apparatus, looking in the direction of the top of FIG. 1, with the memory card removed.

More particularly, and with reference now to FIGS. 2-4 in addition to FIG. 1, header connector housing 12 is unitarily molded of plastic material and includes a pair of generally planar, elongated body portions 18 and two side wing portions 20 whereby the housing is generally U-shaped as seen best in FIG. 2. Side wings 20 define channels 22 (FIG. 4) into which a memory card or IC pack "C" is inserted in the direction of arrow "A". Elongated body portion 18 is adapted for mounting a plurality of terminals having tail portions 24a for insertion into corresponding holes in a printed circuit board 26 whereby the tails can be interconnected, as by soldering, to appropriate circuit traces on the printed circuit board or in the terminal-receiving holes. This is seen best in FIGS. 1, 2 and 3. FIG. 4 shows that the terminals have pins 24b projecting from the side of body portion 18 opposite from tails 24a. The pins are adapted to interconnect with terminals on IC pack "C" when the IC pack is inserted into the header connector. Lastly, housing 12 of header connector 11 includes a pair of apertures 28 (FIG. 4) through which appropriate fastening means can be inserted to fasten the connector apparatus to printed circuit board 26.

Actuating push-rod 16 includes a head portion or push-button 30 at one end thereof and a drive end 32 at the opposite end thereof. The drive end forms part of a complementary interengaging drive means between the push-rod and eject lever 14, as will be seen below. The push-rod is positioned in a closed channel 34 molded integrally with and projecting outwardly from the right-hand side wing 20 of header connector housing 12 as viewed in FIG. 1. Push-button 30 of the push-rod is exposed at the front of housing 12 (the top as viewed in FIGS. 2 and 3), and the drive end 32 of the push-rod projects out of the rear of closed channel 34 for complementary interengagement with eject lever 14. Consequently, the push-rod is reciprocally mounted for movement in the direction of double-headed arrow "B". The push-rod is manually manipulatable by a user pushing on push-button 30 in the direction of arrows "D". Drive end 32 of the push-rod is bifurcated, as seen in FIG. 3, and defines shoulders 36 which snap outwardly of the adjacent end of channel 34 to retain the push-rod on the housing within the channel.

Figure 5:
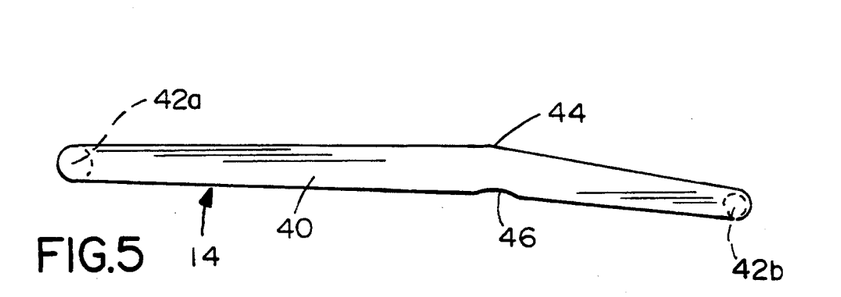
FIG. 5 is a plan view of the eject lever of the apparatus.
Figure 6:
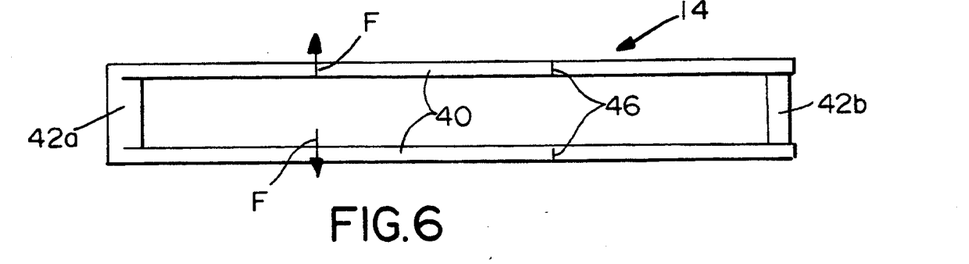
FIG. 6 is an elevational view of the eject lever of FIG. 5.

Referring to FIGS. 5 and 6 in conjunction with FIGS. 1-4, eject lever 14 is elongated and includes a pair of generally parallel arm portions 40 which are spaced apart at opposite ends by cross-portions or end pins 42a and 42b, resulting in a generally box-like configuration as seen in FIG. 6. Arm portions 40 are slightly angled, as at 44, and define a hinge or pivot recess 46 on one side of the lever. Arms 40 are spaced by end pins 42a and 42b at least a distance slightly greater than the width of body portion 18 of header connector housing 12.

Eject lever 14 is assembled to header connector housing 12 as best seen in FIGS. 1 and 4. When assembled, pivot recesses 46 in arms 40 of the lever arm engage a pair of pivot bosses 48 molded integrally with opposite sides (the top and bottom as viewed in FIG. 4) of body portion 18 of header connector housing 12, whereby the eject lever can pivot in the direction of double-headed arrow "E" (FIG. 2).

Eject lever 14 is assembled to header connector housing 12 by spreading arm portions 40 of the lever outwardly in the direction of arrows "F" (FIG. 6), so that the arm portions can snap behind pivot bosses 48 as seen in FIG. 2. This is effected due to the resiliency of the integrally molded eject lever. The arm portions thereby sandwich body portion 18 of the header connector housing therebetween. When the eject lever is assembled to header connector housing 12, as described above, end pin 42a of the lever is engageable with drive end 32 of actuating push-rod 16 outside the header connector housing as seen in FIG. 2. The opposite end pin 42b of eject lever 14 is positioned in a slot 50 in header connector housing 12 whereby the pin is freely movable within the slot as the eject lever moves or pivots in the direction of arrow "E" about pivot bosses 48 on the housing.

In operation, when a memory card or IC pack "C" is inserted or loaded into the header connector housing in the direction of arrow "A" (FIG. 2), as described above, a corner of the IC pack engages end pin 42b of eject lever 14 and biases the lever about pivot bosses 48 to the position shown in FIG. 2. In this loaded condition, the terminal means on the IC pack are in mating interengagement with terminals pins 24b of the header connector.

Figure 7:
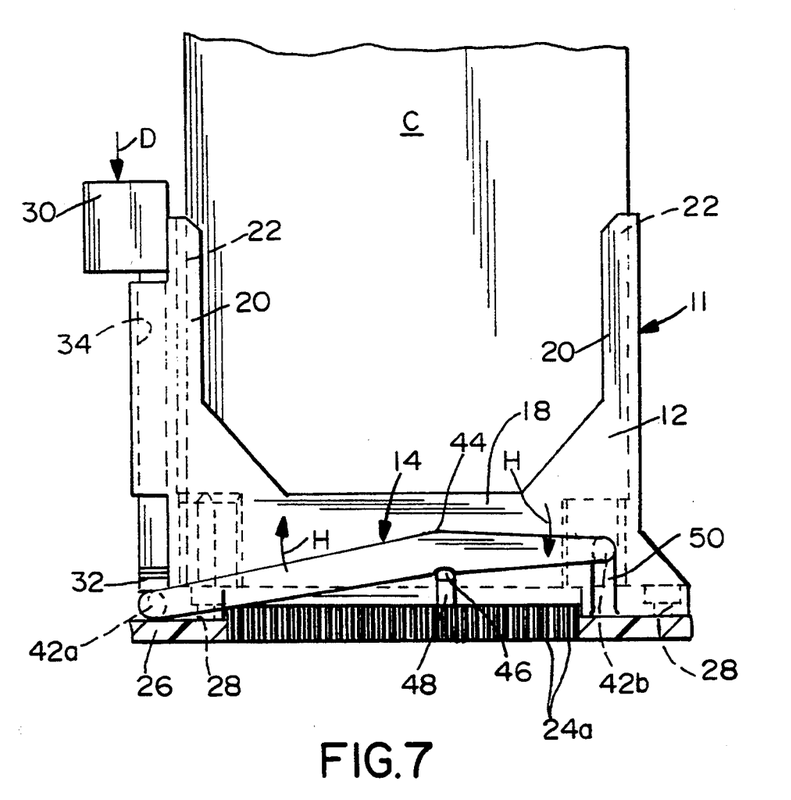
FIG. 7 is a bottom plan view of the apparatus, with the eject lever and push-rod in their ejecting positions.

When it is desired to eject IC pack "C" from header connector 11, and with reference to FIG. 7, a user pushes on push-button 30 of push-rod 16 in the direction of arrow "D". Drive end 32 of the push-rod, being in engagement with end pin 42a of eject lever 14, causes the lever to pivot in the direction of arrow "H" about pivot bosses 48. The opposite end pin 42b of the eject lever moves in slot 50 and, being in engagement with the inner end of IC pack "C", causes the IC pack to be ejected from the header connector at least to the extent of disengaging the terminals of the IC pack from terminal pins 24b of the header connector.

Figure 8:
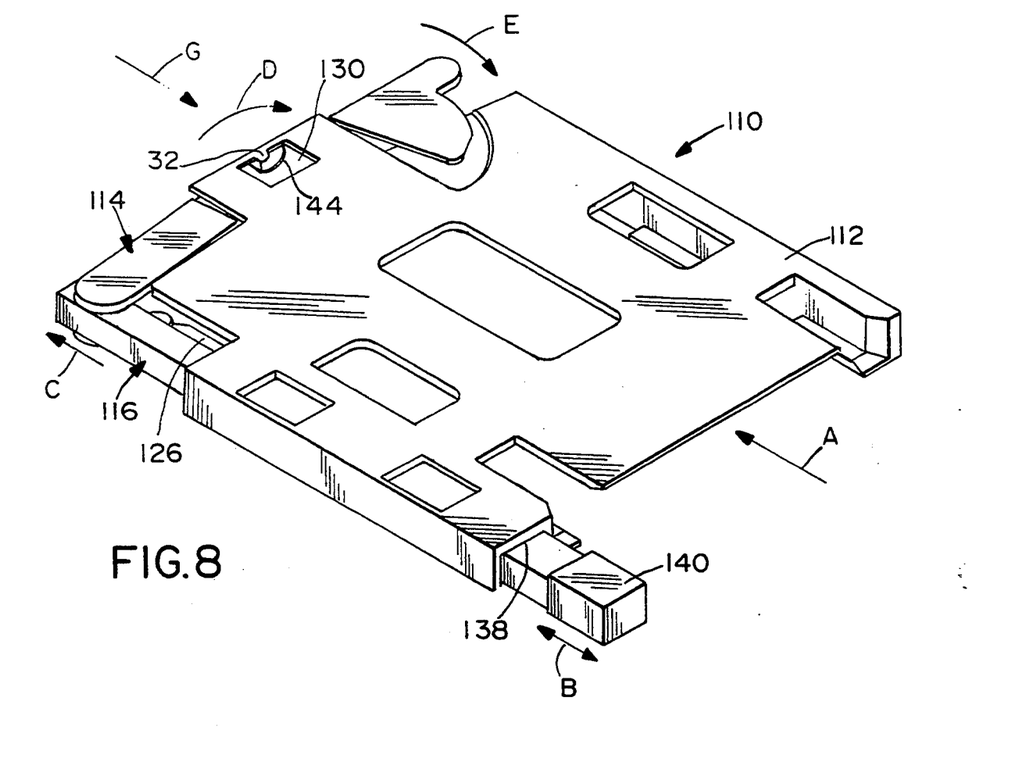
FIG. 8 is a perspective view of a second embodiment of the invention in assembled condition.
Figure 9:
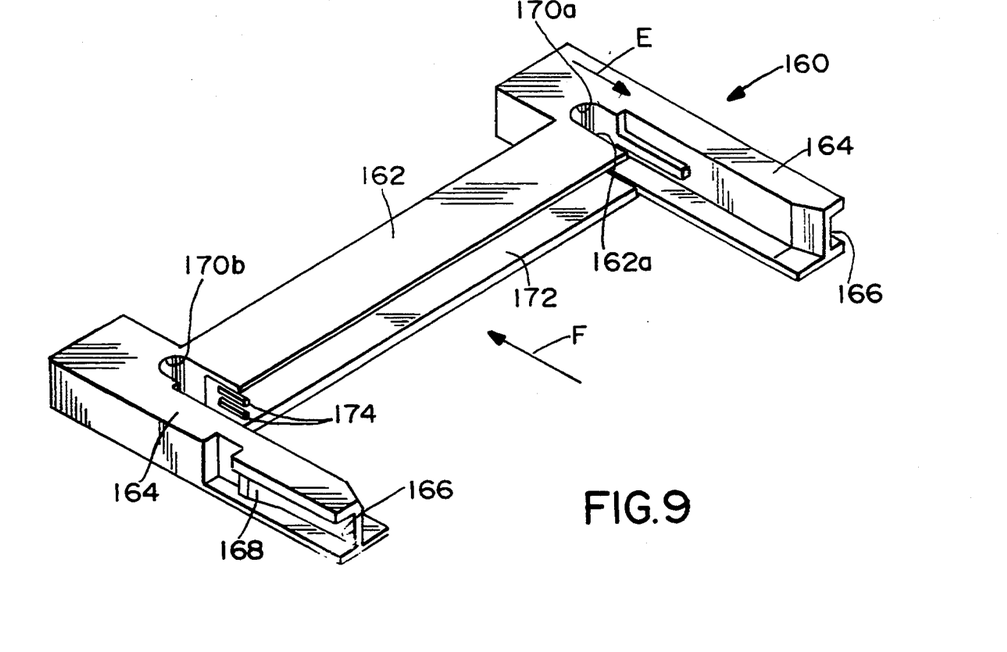
FIG. 9 is a perspective view of a header connector for receiving the ejector mechanism on FIG. 8.

FIG. 8 shows a second embodiment of the invention comprehending a three-part ejector mechanism, generally designated 110. The mechanism is designed for mounting to a header connector into which an IC pack is loaded and from which it is ejected. The header connector is shown in FIG. 9 and will be described in greater detail hereinafter.

Generally, ejector mechanism 110 includes a first part in the form of a housing, generally designated 112; a second part in the form of a one-piece eject lever, generally designated 114; and a third part in the form of a one-piece actuating push-rod, generally designated 116. Each of housing 112, lever 114 and push-rod 116 is individually and integrally molded of dielectric material such as plastic or the like. No other extraneous components are required to assemble or to operate the mechanism.

Figure 10:
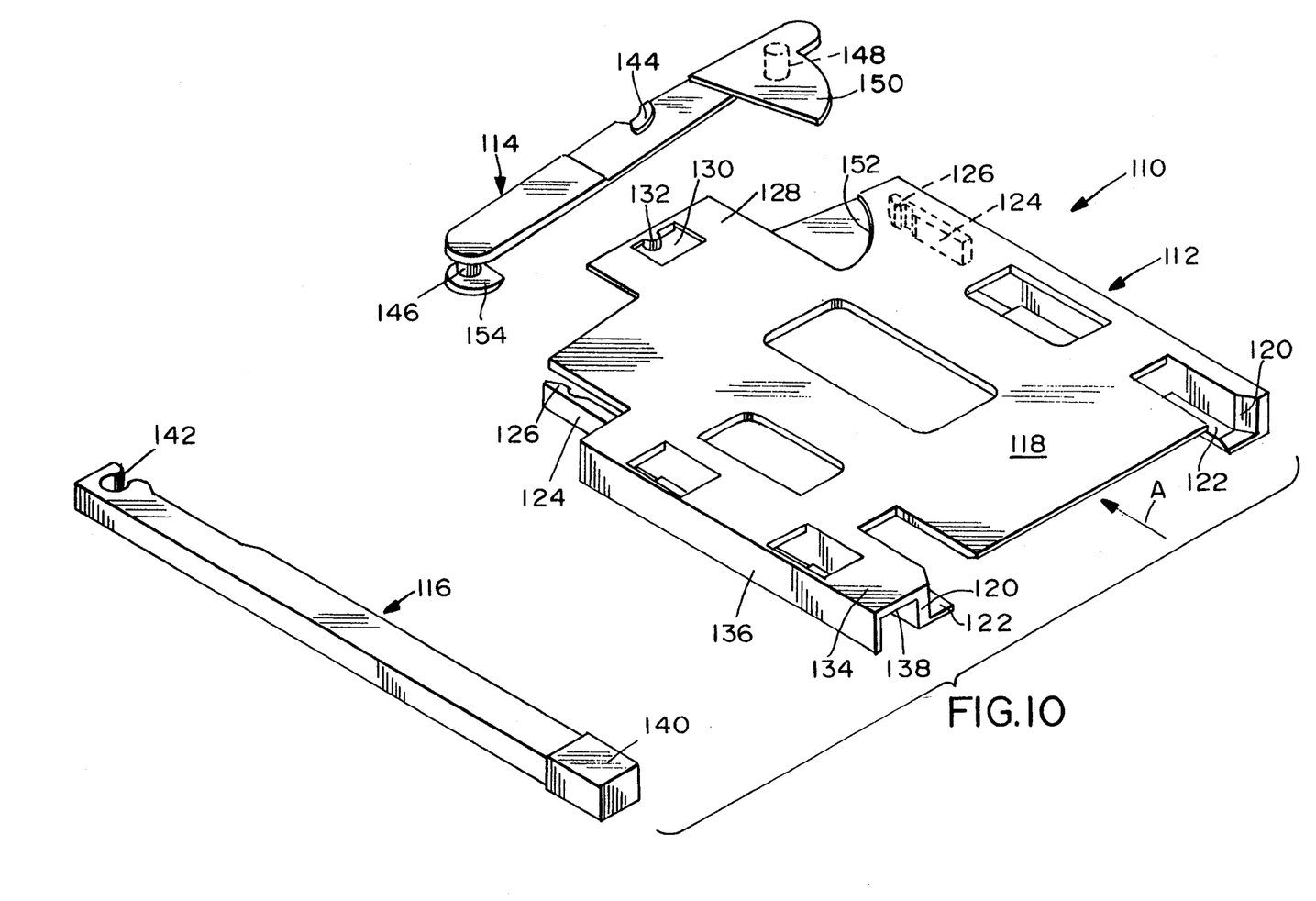
FIG. 10 is an exploded perspective view of the three-part ejector mechanism shown in FIG. 8.

Referring to FIG. 10 in conjunction with FIG. 8, housing 112 is unitarily molded of plastic and includes a generally planar main wall portion 118 and two depending side walls 120. The side walls terminate in one pair of inwardly directed flanges 122 whereby the opposing pairs of side walls and inwardly directed flanges define inwardly directed channels into which an IC pack or memory card (not shown) is inserted into the housing in the direction of arrow "A".

Housing 112 further includes a pair of resilient cantilevered latch arms 124 which form continuations of side walls 120, each latch arm including an inwardly directed latch hook 126. The latch arms and latch hooks are provided within the housing to allow retention to a header connector (FIG. 9) mounted to a printed circuit board, all of which will be described hereinafter.

Still further, housing 112 includes a rearwardly projecting flange portion 128 which forms a continuation of top wall 118. The flange portion has a cut-out area 130, with a pivot boss 132 projecting into the cut-out area. This structure is provided for pivotally mounting eject lever 114, as will be described hereinafter. Top wall 118 also has a flange portion 134 which forms a continuation of the top wall and protrudes outwardly from one side of the top wall, with a downwardly depending outside wall 136 extending along the side edge of the flange portion approximately parallel to one sidewall 120. Outside wall 136 is connected to sidewall 120 by way of two connecting webs (not shown) which lie approximately parallel to top wall 118. Outside wall 136, sidewall 120, top wall 118 and the two connecting webs define a channel 138 within which push-rod 116 is reciprocally mounted.

Figure 11:
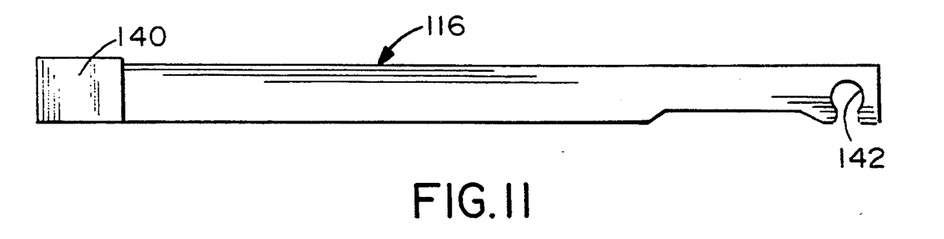
FIG. 11 is a top plan view of the actuating push-rod of the ejector mechanism, as viewed in FIG. 10.
Figure 12:
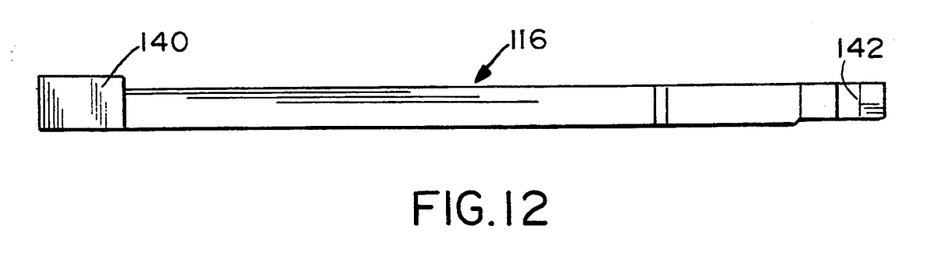
FIG. 12 is a side elevational view of the push-rod of FIG. 11.

Referring to FIGS. 11 and 12 in conjunction with FIGS. 8 and 10, actuating push-rod 116 includes a head portion or push-button 140 at one end thereof and a transverse keyhole-shaped hinge slot 142 at the opposite end thereof. The slot forms part of a complementary interengaging drive means between the push-rod and eject lever 114, as will be seen below. As illustrated in FIG. 8, push-rod 116 is positioned in channel 138 of housing 112 whereby push-button 140 is exposed at the front of the housing and the opposite or slotted end of the push-rod projects out of the rear of the housing for complementary interengagement with eject lever 114.

Figure 13:
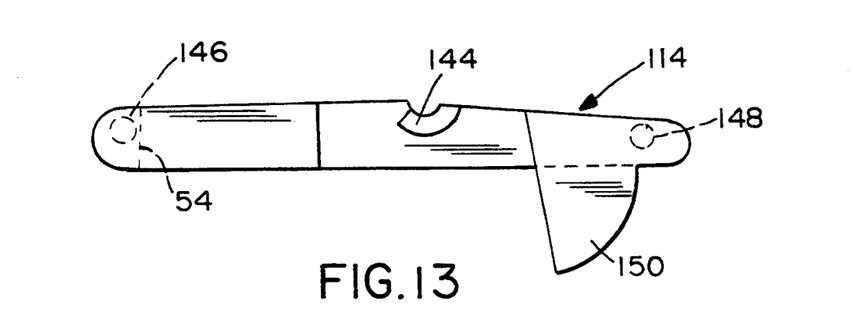
FIG. 13 is a top plan view of the ejecting lever of the ejector mechanism, as viewed in FIG. 10.
Figure 14:
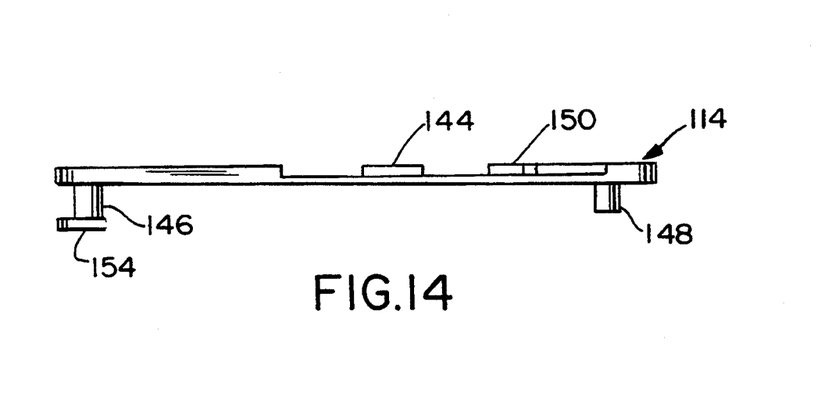
FIG. 14 is a side elevational view of the ejecting lever of FIG. 13.
Figure 15:
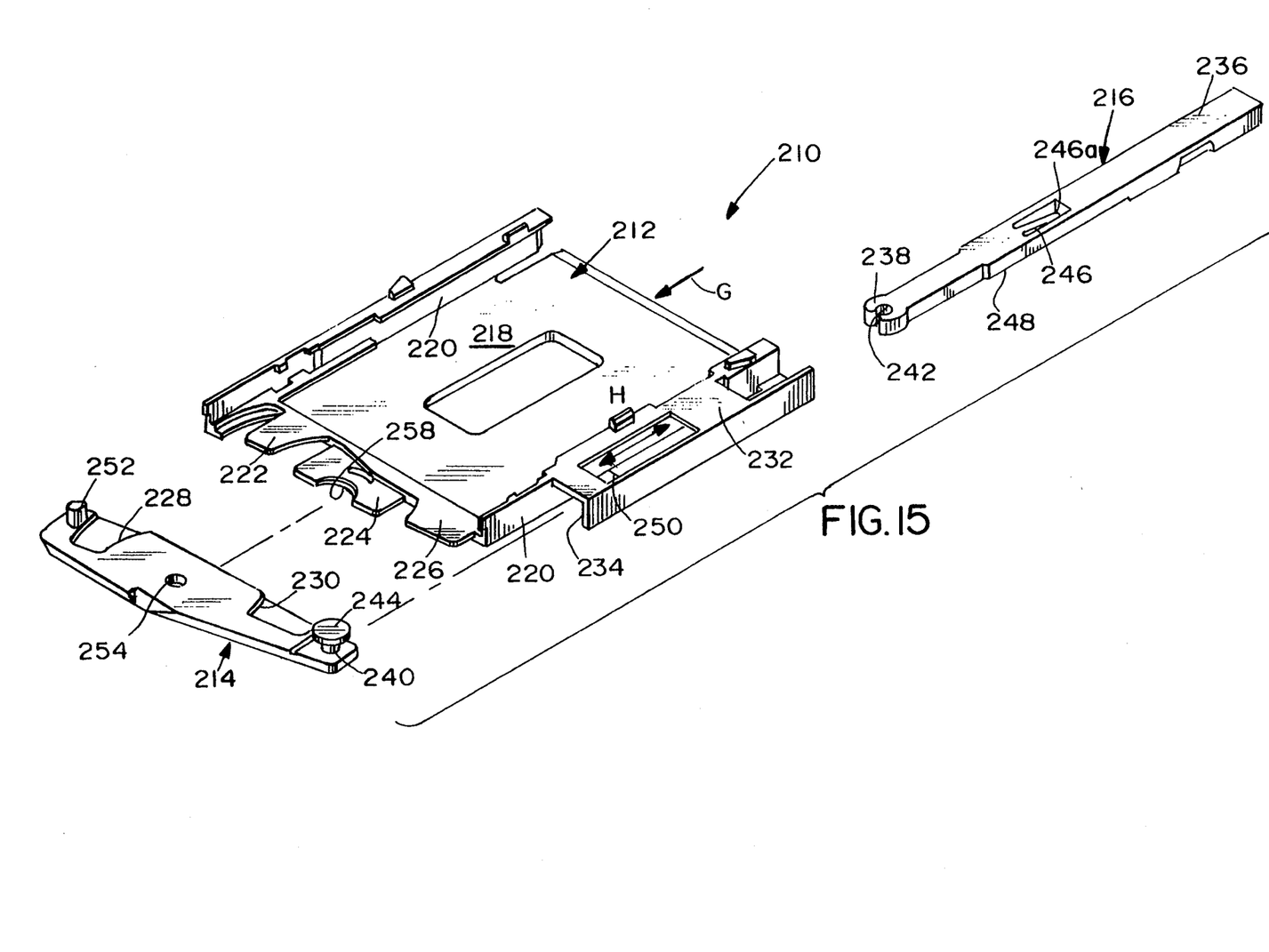
FIG. 15 is an exploded perspective view of a third embodiment of the invention in disassembled condition.

Referring to FIGS. 13 and 14 in conjunction with FIGS. 8 and 6, eject lever 114 has an arcuately shaped fulcrum boss 144 intermediate the ends of the lever, a downwardly depending hinge pin 146 at one end of the lever, and a downwardly depending eject peg 148 at the opposite end of the lever. A fan-shaped stabilizing flange 150 projects from the top of the lever for positioning in a fan-shaped cut-out 152 in the top of wall portion 118 of housing 112. Lastly, a transverse positioning flange 154 is provided at the bottom of hinge pin 146 at the one end of the lever.

In assembly, and comparing the exploded view of the three-part ejector mechanism shown in FIG. 10 with the assembled mechanism shown in FIG. 8, push-rod 116 simply is located in channel 138 of housing 112 whereby the push-rod is reciprocally, axially movable relative to the housing in the direction of arrow "B" (FIG. 8). Either before or after the push-rod is located in channel 138, eject lever 114 is assembled to the housing. In assembly, the lever is positioned so that fulcrum boss 144 projects upwardly in the cut-out 130 of the housing whereby the arcuate shape of the fulcrum boss cooperates with pivot boss 132 within the cut-out. With the lever underlying flange 128 of the housing, stabilizing flange 150 of the lever positions into cut-out 152 in the top of main wall portion 118 of the housing. Therefore, the lever is maintained in a vertically stabilized position by the lever underlying flange portion 128 of the housing and stabilizing flange 150 of the lever overlying the top wall of the housing in cut-out 152 thereof. In essence, pivot boss 132 of the housing and fulcrum boss 144 of the lever provide complementary interengaging motion transmitting means between the two parts.

The assembly is completed by snapping hinge pin 146, which depends from the one end of eject lever 114, into hinge slot 142 at the rear end of actuating push-rod 116. As stated above, hinge slot 142 is keyhole-shaped so that it provides a mouth by which hinge pin 146 can be snap-fit into the slot. When the push-rod and lever are assembled, the one end of the lever, surrounding hinge pin 146, overlies the inner end of the push-rod, and flange 154, at the bottom of hinge pin 146, underlies the push-rod so that the push-rod is sandwiched therebetween.

In operation, when actuating push-rod 116 is moved axially in the direction of arrow "C" (FIG. 8), eject lever 114 will pivot in the direction of arrow "D" about pivot boss 132 and fulcrum boss 144, to drive the free end of the lever in the direction of arrow "E".

Referring now to FIG. 9, a header connector, generally designated 160, includes a transverse elongated body portion 162 and two side wings 164. The side wings have outside channels 166 in which a pair of outwardly projecting ramped latch bosses 168 are integrally molded. Slots 170a and 170b are formed in side wings 164 outside the ends of body portion 162. In other words, an open area is afforded beyond the opposite ends 162a of the body portion. The body portion also has a card-receiving slot 172 running the length thereof. Although only two pins are shown in FIG. 9, a high density plurality of terminal pins 174 are mounted within body portion 162 and extend into slot 172. When a memory card or IC pack is loaded into header connector 160, it is loaded in the direction of arrow "F", into slot 172 whereupon appropriate terminal means on the IC pack interengage with terminal pins 174 of the header connector. It should be noted that when the IC pack is loaded into slot 172 into electrical interengagement with terminal pins 174, it extends substantially entirely between side wings 164, thereby covering the opening of slot 170a into which eject peg 148 of eject lever 114 is positioned.

Referring to FIGS. 9 and 10 in conjunction with FIG. 8, ejector mechanism 110 is mounted in header connector 160 in the direction of arrow "F" (FIG. 8). When fully mounted in the header, ramped latch bosses 168, located within outside channels 166 of header connector 160, snap behind latch hooks 126 on the distal ends of resilient latch arms 124 to hold the housing 112 of the ejector mechanism relative to header connector 160. When so mounted, ejecting pin 148, which depends from the underside of ejecting lever 114, will become seated in the bottom or base of slot 170a in one of the side wings 164 of the header connector. The assembled ejector mechanism and header connector are now ready for receiving the IC pack which is to be loaded into slot 172 of the header connector.

When it is desired to eject or unload the IC pack from header connector 160, actuating push-rod 116 simply is pushed in the direction of arrow "C" (FIG. 8). Before proceeding further, it should be remembered that, as noted above, the IC pack extends substantially entirely between side wings 164 of body portion 162 of header connector 160 covering slot 170a in one of the side wings of the header connector. Therefore, ejecting peg 148 of ejecting lever 114 is located in slot 170a "behind" the IC pack. With this understanding, as actuating push-rod 116 is moved in the direction of arrow "C", and eject lever 114 is pivoted in the direction of arrow "D", eject peg 148 will move in the direction of arrow "E". This directional arrow "E" is also depicted in FIG. 9, so that it can be better understood that the eject peg will engage one corner of the IC pack and eject the IC pack from the header connector.

From the foregoing, it can be understood that an extremely simple ejector system has been provided in the form of a three-part ejector mechanism. Each of the three parts, namely housing (12,112), eject lever (14,114) and actuating push-rod (16,116), is unitarily and integrally molded of dielectric material such as plastic or the like. The interengaging means between the three parts are provided by integrally molded features on each part. No other extraneous parts are required. The IC pack is ejected from the header connector by a portion of the eject lever which is an integrally molded component thereof, requiring no additional ejecting components.

FIGS. 15-18 show a third embodiment of the invention embodied in a three-piece ejector mechanism, generally designated 210, similar to the embodiment of FIGS. 8-14 in that the ejector mechanism shown in FIGS. 15-18 is separate from a header connector, generally designated 211. In other words, ejector mechanism 210 is designed for mounting to header connector 211 into which an IC pack is loaded and from which it is ejected.

Generally, ejector mechanism 210 includes a first part in the form of a housing, generally designated 212, a second part in the form of a one-piece eject lever, generally designated 214, and a third part in the form of a one-piece actuating push-rod, generally designated 216. Each of housing 212, lever 214 and push-rod 216 is individually and integrally molded of dielectric material such as plastic or the like.

Figure 16:
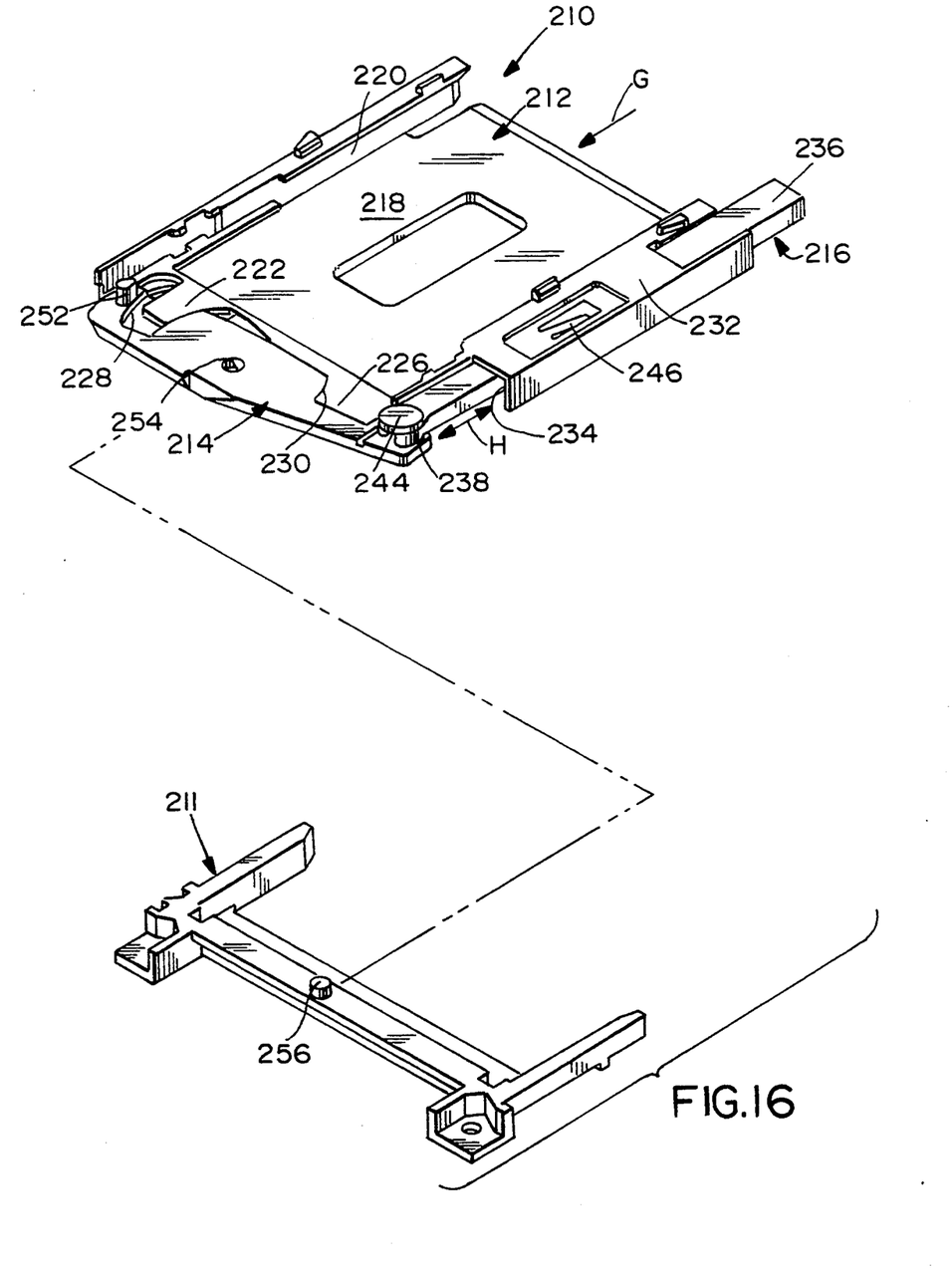
FIG. 16 is a perspective view of the embodiment of FIG. 15, in assembled condition.
Figure 17:
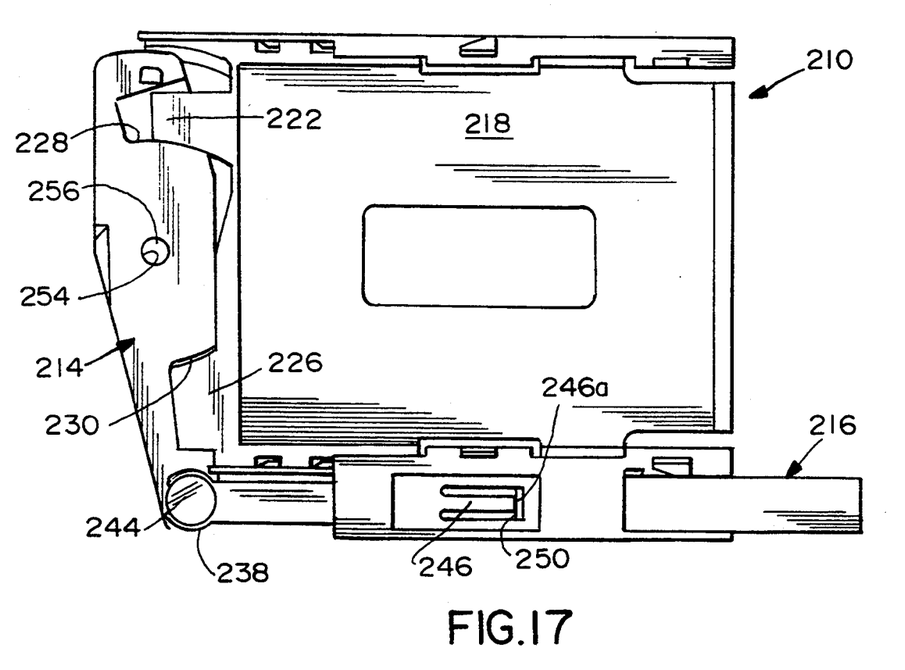
FIG. 17 is a plan view of the ejector mechanism of FIGS. 15 and 16, with the eject lever and push-rod in their non-ejecting positions.
Figure 18:
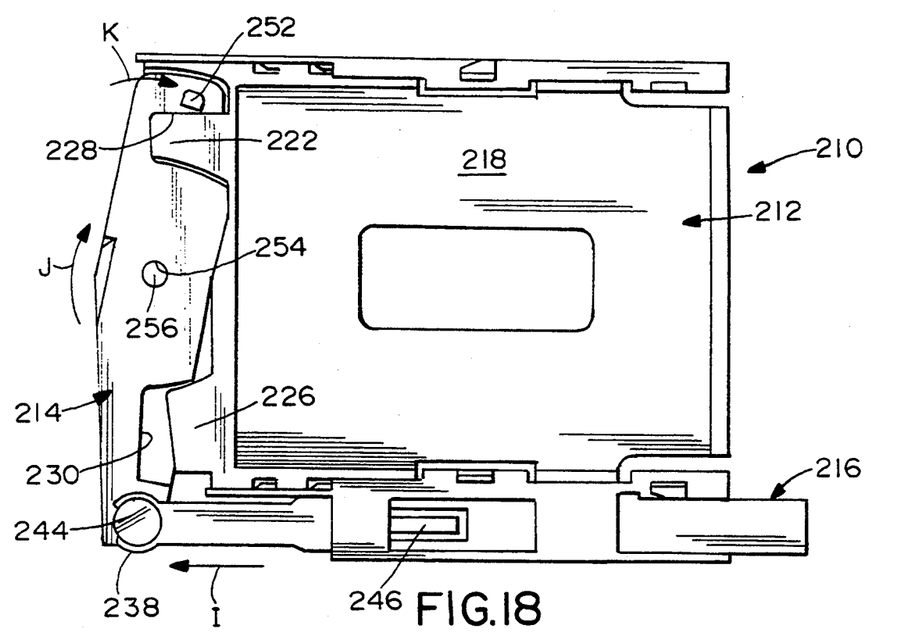
FIG. 18 is a view similar to that of FIG. 17, with the eject lever and push-rod in their ejecting positions.

Housing 212 includes a generally planar main wall portion 218 and opposite side walls 220 which define channels into which an IC pack or memory card (not shown) is inserted in the direction of arrow "G". Housing 212 further includes rearwardly projecting guide flanges 222, 224 and 226 which sandwich eject lever 214 therebetween. In other words, flanges 222 and 226 are disposed in cut-outs 228 and 230, respectively, on one side of the eject lever, and flange 224 is located on the other side of the eject lever, in the assembled condition of the ejector mechanism as shown in FIGS. 16-18. Lastly, outside wall means 232 defines a channel 234 within which push-rod 216 is positioned and slidably or reciprocally movable in the direction of double-headed arrow "H".

Push-rod 216 includes a pusher end 236 and a lever-engaging end 238. As with the previous embodiments, generally, complementary interengaging drive means are provided between push-rod 216 and eject lever 214. Specifically, the lever includes a hinge pin 240 which is snap-fit into a hinge slot 242 at the inner or drive end of push-rod 216. A flange 244 overlies the push-rod so that the push-rod is sandwiched therebetween.

The embodiment of the ejector mechanism 210 shown in FIGS. 15-18 includes a feature to prevent push-rod 16 from being pulled out of channel 234 and out of engagement with hinge pin 240 of eject lever 214. More particularly, referring specifically to FIG. 15, a stop-limit latch is provided by a cantilevered ramp arm 246 having a latch end 246a which projects beyond a surface 248 of push-rod 216. Housing 212 includes a latch shoulder 250 within channel 234 which defines a latching surface behind which latch end 246a of cantilevered ramp arm 246 snaps when the push-rod is assembled to the housing within channel 234.

Eject lever 214 has an eject peg 252 for engaging a corner of an IC pack as described above. The eject lever also has a fulcrum defined by a hole 254 therethrough for receiving a pivot pin or boss 256 projecting from header connector 211. Otherwise, the header connector is functionally the same as described above in relation to header connector 160 of the embodiment of FIG. 9. It can be seen in FIG. 15 that flange 224 of housing 212 has a cut-out area 258 so that pivot pin or boss 256 can project from the header connector into fulcrum hole 254 of eject lever 214.

In assembly, housing 212 of ejector mechanism 210 is mounted to header connector 211 similar to the embodiment of FIGS. 8-14. When fully mounted, eject lever 214 is positioned so that pivot pin or boss 256 of the header connector is positioned in fulcrum hole 254 of the eject lever. Push-rod 216 then is inserted into channel 234 of housing 212 and is interengaged with the eject lever by snapping hinge pin 240 of the lever into hinge slot 242 of the push-rod. This assembled condition is shown in FIG. 17, and it should be noted that the stop-limit latch for push-rod 216 has been effected by latch end 246a of cantilevered ramp arm 246 snapping behind latch shoulder 250. It also can be seen that stabilizing flanges 222 and 226 of housing 212 are seated within cut-out areas 228 and 230, respectively, of eject lever 214. The assembled ejector mechanism 210 and header connector 211 now are ready for receiving an IC pack to be inserted or loaded thereinto.

When it is desired to eject or unload the IC pack, actuating push-rod 216 is pushed in the direction of arrow "I" (FIG. 18). This causes eject lever 214 to be pivoted in the direction of arrow "J", with eject peg 252 of the lever moving in the direction of arrow "K". The eject peg will engage one corner of the IC pack and eject the IC pack from the header connector. During the pivotal movement of eject lever 214, it can be seen how stabilizing flanges 222 and 226 ride in their respective slots 228 and 230 on opposite sides of the pivotal connection 254 and 256 between the eject lever and the header connector.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein. For example, any eject lever (14,114, 214) may be adapted for use in any embodiment.

We claim:

1. A connector apparatus for providing an interconnection between an IC pack and a printed circuit board, including
   a plurality of terminals (174) adapted for inter-connection of the IC pack to electrical traces on the printed circuit board,
   housing means including a housing (12, 112, 212) having an IC pack receiving opening and an integrally formed channel (34, 138, 234) therein,
   said IC pack being inwardly and outwardly movable within the housing between an inserted position wherein it electrically mates with the terminals and an ejected position wherein a portion of the IC pack extends outside the opening,
   an ejector mechanism (10, 110, 210) for selectively moving an inserted IC pack from the inserted position to the ejected position, said ejector mechanism having
      an ejector arm pivotally mounted relative to the housing adapted to effect movement of the IC pack to the ejected position, and
      a manually manipulatable actuator (16, 116, 216) slidably mounted in said channel for movement in the same general direction as the insertion and ejection of the IC pack and adapted to cooperate with said ejector arm in moving the IC pack outwardly to the ejection position,
   the improvement comprising:
   said ejector arm defines an elongated lever (14, 114, 214) pivotally mounted on the housing means intermediate opposite ends thereof and extending substantially entirely across the integrally formed channel of the housing means, said elongated lever having a first end pivotally connected to said actuator and a second end for directly engaging the IC pack when said pack is in the inserted position;
   whereby when the actuator is moved inwardly, the second end of the lever moves the IC pack outwardly to the ejected position.

2. The connector apparatus of claim 1, said housing means further including a dielectric header (160, 211) separate from said housing, wherein said terminals (174) are mounted in said header (160, 211) and said housing has integrally molded means (124) for removably attaching to said header (160, 211).

3. The connector apparatus of claim 1, wherein said lever (114, 214) includes fulcrum means (144, 254)) for pivotally mounting to an integrally molded pivot boss (132, 256) on the housing means.

4. The connector apparatus of claim 1, wherein said lever includes an integrally molded ejecting pin (148) adapted to engage a corner of the IC pack to effect ejection of the IC pack.

5. The connector apparatus of claim 1, wherein said lever further includes a pair of generally parallel spaced apart arm portions (40) mounted on said header, whereby said header is sandwiched therebetween.

6. The connector apparatus of claim 5, wherein said lever further includes pivot recesses (46) interengageable with integrally molded pivot bosses (48) on the housing.

7. The connector apparatus of claim 1, further including a stabilizing flange (150, 222, 226) integrally molded on one of said lever (114, 214) and said housing (112, 212) and engageable with a cut-out portion (152, 228, 230) on the other of said lever and said housing for stabilizing pivotal movement of the lever.

8. The connector apparatus of claim 7, further including two of each of said stabilizing flange and said cut-out portion (222,226), wherein one of said stabilizing flanges (222,226) and one of said cut-out portions (228,230) are located on each opposite side of the pivotal mounting of said lever (214).

9. The connector apparatus of claim 1, further including a stop-limit latch (246) on said slidably mounted actuator (216) engageable with a stop surface (250) on the housing (212) to prevent the actuator from being pulled out of said channel (234).

10. The connector apparatus of claim 9, wherein said stop-limit latch is a cantilevered ramp arm (246) integrally molded on the actuator (216).

* * * * *